United States Patent
Pirjaberi

(10) Patent No.: US 6,304,111 B1
(45) Date of Patent: Oct. 16, 2001

(54) CMOS SWITCH CIRCUIT HAVING CONCURRENTLY SWITCHING COMPLEMENTARY OUTPUTS INDEPENDENT FROM PROCESS VARIATION

(75) Inventor: Mohammad R. Pirjaberi, San Jose, CA (US)

(73) Assignee: ZiLOG, Inc., Campbell, CA (US)

(*) Notice: Subject to any disclaimer, the term of this patent is extended or adjusted under 35 U.S.C. 154(b) by 0 days.

(21) Appl. No.: 09/570,400

(22) Filed: May 12, 2000

(51) Int. Cl.[7] ............................... H03B 1/00; H03K 3/00
(52) U.S. Cl. .................. 327/112; 327/376; 327/387; 327/416; 327/309; 327/108; 327/257; 326/83
(58) Field of Search ........................ 327/112, 108, 327/256–257, 374, 376, 382, 387, 415, 416, 309, 310, 313, 318, 321, 170; 326/83, 27, 31, 32; 365/198, 189.05

(56) References Cited

U.S. PATENT DOCUMENTS

| | | | |
|---|---|---|---|
| 5,315,187 | * 5/1994 | Cheng | 327/384 |
| 5,369,316 | * 11/1994 | Chen et al. | 327/108 |
| 5,491,432 | * 2/1996 | Wong et al. | 326/86 |
| 5,506,528 | * 4/1996 | Cao et al. | 327/108 |
| 5,739,713 | * 4/1998 | Sharpe-Geisler | 327/108 |
| 5,929,654 | * 7/1999 | Park et al. | 326/27 |
| 6,225,847 | * 5/2001 | Kim | 327/257 |

* cited by examiner

Primary Examiner—Terry D. Cunningham
Assistant Examiner—Long Nguyen
(74) Attorney, Agent, or Firm—Skjerven, Morrill, MacPherson, LLP

(57) ABSTRACT

A CMOS switch circuit includes a first stage having PMOS and NMOS transistors arranged and properly sized to provide substantially concurrently switching complementary outputs, and a second stage having PMOS and NMOS transistors arranged and related to counterparts in the first stage so as to provide substantially concurrently switching complementary outputs that are substantially process independent.

20 Claims, 1 Drawing Sheet

CMOS SWITCH CIRCUIT HAVING CONCURRENTLY SWITCHING COMPLEMENTARY OUTPUTS INDEPENDENT FROM PROCESS VARIATION

FIELD OF THE INVENTION

The present invention generally relates to CMOS switch circuits and in particular, to a CMOS switch circuit having concurrently switching complementary outputs independent from process variation.

BACKGROUND OF THE INVENTION

CMOS switch circuits having complementary outputs are useful in circuit applications such as driving the control inputs of a transmission gate. In such and other applications, it is desirable for the complementary outputs to switch concurrently to minimize noise injection into the circuit.

In a conventional method of designing a CMOS switch circuit, the circuit is optimized for concurrent switching during computer simulation employing timing models associated with nominal process parameters. In practice, however, process variations during manufacture are inevitable. Accordingly, switching of the complementary outputs of such manufactured CMOS switch circuits may be less than concurrent.

OBJECTS AND SUMMARY OF THE INVENTION

Accordingly, it is an object of the present invention to provide a CMOS switch circuit having concurrently switching complementary outputs.

Another object is to provide a CMOS switch circuit having concurrently switching complementary outputs independent from process variation.

These and additional objects are accomplished by the various aspects of the present invention, wherein briefly stated, one aspect is a CMOS switch circuit having concurrently switching complementary outputs. The CMOS switch circuit includes a first stage having PMOS and NMOS transistors arranged and properly sized to provide substantially concurrently switching complementary outputs. Preferably, it also includes a second stage having PMOS and NMOS transistors arranged and related to counterparts in the first stage so as to provide substantially concurrently switching complementary outputs that are substantially process independent.

Another aspect is a method of forming a CMOS switch circuit having concurrently switching complementary outputs, comprising forming a first stage having PMOS and NMOS transistors arranged and properly sized to provide substantially concurrently switching complementary outputs. Preferably, the method also includes forming a second stage having PMOS and NMOS transistors arranged and related to counterparts in the first stage so as to provide substantially concurrently switching complementary outputs that are substantially process independent.

Additional objects, features and advantages of the various aspects of the present invention will become apparent from the following description of its preferred embodiments, which description should be taken in conjunction with the accompanying drawings.

DETAILED DESCRIPTION OF THE PREFERRED EMBODIMENT

Figure 1:
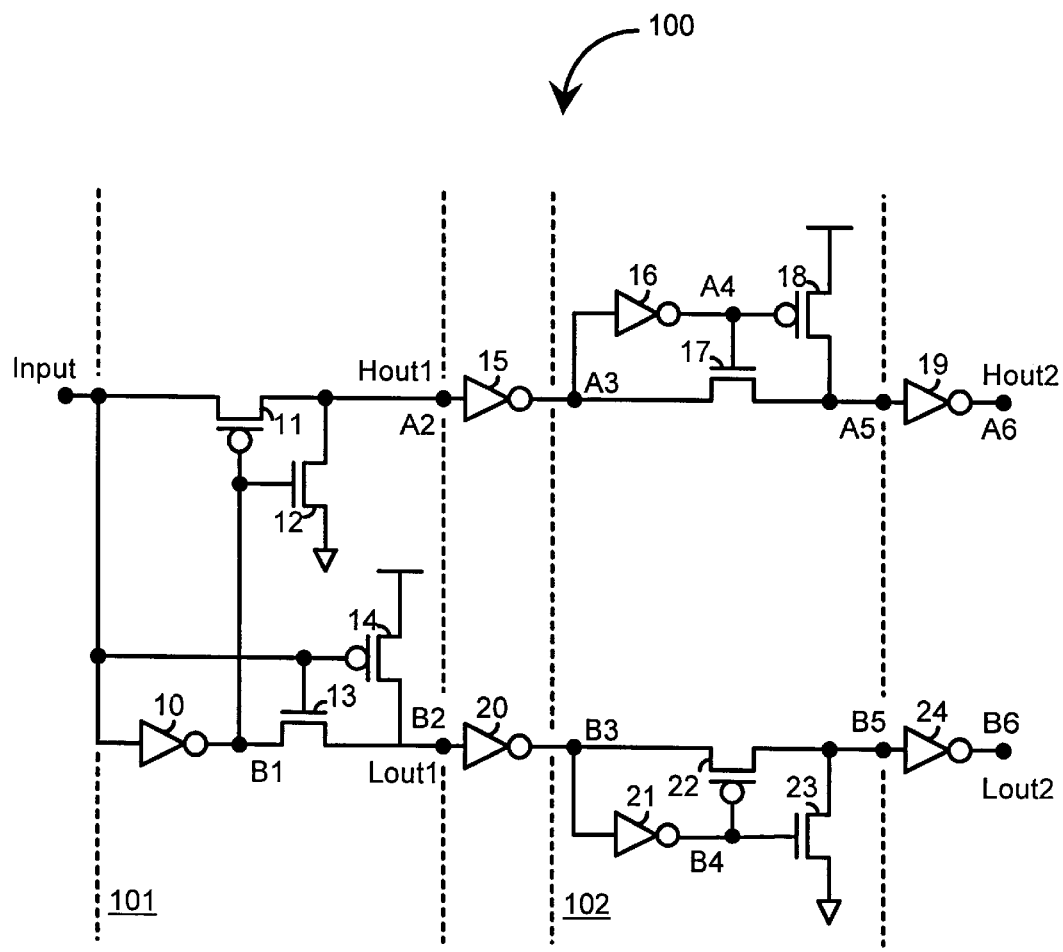
FIG. 1 illustrates a circuit diagram of a CMOS switch circuit having concurrently switching complementary outputs independent of process variation, utilizing aspects of the present invention.

FIG. 1 illustrates a circuit diagram of a CMOS switch circuit 100 having concurrently switching complementary outputs (Hout2, Lout2) independent of process variation. The CMOS switch circuit 100 includes a first stage 101 having PMOS (11, 14) and NMOS (12, 13) transistors arranged and properly sized to provide substantially concurrently switching complementary outputs (Hout1, Lout1), and a second stage 102 having PMOS (18, 22) and NMOS (17, 23) transistors arranged and related to counterparts in the first stage 101 so as to provide substantially concurrently switching complementary outputs (Hout2, Lout2) that are substantially process independent.

The first stage 101 includes a first inverter 10, a first PMOS transistor 11, a first NMOS transistor 12, a second NMOS transistor 13, and a second PMOS transistor 14. The inverter 10 input and the first PMOS transistor 11 source are coupled to an input signal Input. The first NMOS transistor 12 source is coupled to a low reference voltage, the first PMOS 11 and first NMOS 12 transistor gates are coupled to the first inverter 10 output, and the first PMOS 11 and first NMOS 12 transistor drains are coupled together and provide the first output Hout1. The second NMOS transistor 13 source is coupled to the first inverter 10 output, the second PMOS transistor 14 source is coupled to a high reference voltage, the second NMOS 13 and the second PMOS 14 transistor gates are coupled to the input signal Input, and the second NMOS 13 and the second PMOS 14 transistor drains are coupled together and provide a second output Lout1, wherein the first and second outputs Hout1, Lout1 are a first pair of complementary outputs.

The first PMOS 11, first NMOS 12, second NMOS 13, and second PMOS 14 transistors are sized such that the first Hout1 and second Lout1 outputs of the first pair of complementary outputs (Hout1, Lout1) are substantially concurrently switching complementary outputs in response to the input signal Input. In particular, the first NMOS 12 and second NMOS 13 transistors are sized relative to the first PMOS 11 and second PMOS 14 transistors so as to have greater drive capability than the first PMOS 11 and second PMOS 14 transistors. Preferably, the first NMOS 12 and second NMOS 13 transistors are sized relative to the first PMOS 11 and second PMOS 14 transistors so as to have at least twice the drive capability than the first PMOS 11 and second PMOS 14 transistors. On the other hand, relative to each other, the first NMOS 12 and second NMOS 13 transistors are identically sized, and the first PMOS 11 and second PMOS 14 transistors are identically sized.

By sizing the first PMOS 11, first NMOS 12, second NMOS 13, and second PMOS 14 transistors in this fashion, concurrent switching between the first output Hout1 and the second output Lout1 is improved, for example, by creating a contention situation between the second NMOS 13 and second PMOS 14 transistors when the input signal Input transitions from a HIGH to LOW logic level, so that the second PMOS 14 transistor can not immediately pull node B2, and thus, the second output Lout1, up to the high reference voltage when the input signal Input transitions from a HIGH to LOW logic level. Consequently, the switching of the second output Lout1 is slowed down so as to be concurrent with that of the first output Hout1 in this case.

Proper sizing of the first PMOS 11, first NMOS 12, second NMOS 13, and second PMOS 14 transistors are determined in the design phase of the CMOS switch circuit 100 through computer circuit simulations using timing models corresponding to nominal process conditions. In practice, this involves modifying the relative sizing between the PMOS (11, 14) and NMOS (12, 13) transistors until the complementary outputs of the CMOS switch circuit 100 exhibit concurrent switching characteristics. Process variations in the manufacture of the CMOS switch circuit 100, however, may cause actual silicon timings to vary significantly from such timing models. When such process variations result in the relative turn-on and turn-off times of the PMOS and NMOS transistors changing significantly, the concurrency of the switching between the complementary outputs Hout1 and Lout1 may deteriorate.

To compensate for such process variations, the second stage 102 effectively complements the first stage 101 so as to make the CMOS switch circuit 100 substantially process independent. It does this by making the path from the input signal Input to both the first Hout2 and second Lout2 outputs of the second pair of complementary outputs (Hout2, Lout2) always result from the turning on of exactly one PMOS transistor and one NMOS transistor, regardless of whether the input signal Input is transitioning from a LOW to a HIGH logic level, or from a HIGH to a LOW logic level.

The second stage 102 includes a third NMOS transistor 17, a third PMOS transistor 18, a fourth PMOS transistor 22, and a fourth NMOS transistor 23. The third NMOS transistor 17 source is coupled to the first output Hout1, the third PMOS transistor 18 source is coupled to the high reference voltage, the third NMOS 17 and third PMOS 18 transistor gates are coupled together and to the first output Hout1, and the third NMOS 17 and third PMOS 18 transistor drains are coupled together and drive a first output Hout2 of a second pair of complementary outputs (Hout2, Lout2). The fourth PMOS transistor 22 source is coupled to the second output Lout1 of the first pair of complementary outputs (Hout1, Lout1), the fourth NMOS transistor 23 source is coupled to the low reference voltage, the fourth PMOS 22 and fourth NMOS 23 transistor gates are coupled together and to the second output Lout1 of the first pair of complementary outputs (Hout1, Lout1), and the fourth NMOS 23 and fourth PMOS 22 transistor drains are coupled together and drive a second output Lout2 of the second pair of complementary outputs (Hout2, Lout2).

The first PMOS 11, first NMOS 12, second NMOS 13, second PMOS 14, third NMOS 17, third PMOS 18, fourth PMOS 22, and fourth NMOS 23 transistors are sized such that the first Hout2 and second Lout2 outputs of the second pair of complementary outputs (Hout2, Lout2) are substantially concurrently switching complementary outputs in response to the input signal Input, and substantially process independent. Preferably, first NMOS 12, second NMOS 13, third NMOS 17, and fourth NMOS 23 transistors are identically sized, and the first PMOS 11, second PMOS 14, third PMOS 18, and fourth PMOS 22 transistors are identically sized.

Second 15, third 16, fourth 19, fifth 20, sixth 21 and seventh 24 inverters are inserted in the CMOS switch circuit 100 to maintain logic integrity so that the logic level on the first output Hout2 of the second pair of complementary outputs (Hout2, Lout2) is the same logic level as the input signal Input, and the logic level on the second output Lout2 of the second pair of complementary outputs (Hout2, Lout2) is its complement.

Although the various aspects of the present invention have been described with respect to a preferred embodiment, it will be understood that the invention is entitled to full protection within the full scope of the appended claims.

What is claimed is:

1. A CMOS switch circuit having concurrently switching complementary outputs, comprising:

a first inverter having an input and output, said first inverter input coupled to an input signal;

first PMOS and first NMOS transistors, said first PMOS transistor source coupled to said input signal, said first NMOS transistor source coupled to a low reference voltage, said first PMOS and said first NMOS transistor gates coupled to said first inverter output, and said first PMOS and said first NMOS transistor drains coupled together and providing a first output of a first pair of complementary outputs; and second NMOS and second PMOS transistors, said second NMOS transistor source coupled to said first inverter output, said second PMOS transistor source coupled to a high reference voltage, said second NMOS and said second PMOS transistor gates coupled to said input signal, and said second NMOS and said second PMOS transistor drains coupled together and providing a second output of said first pair of complementary outputs;

wherein said first PMOS, said first NMOS, said second NMOS, and said second PMOS transistors are sized such that said first and said second outputs of said first pair of complementary outputs are substantially concurrently switching complementary outputs in response to said input signal.

2. The CMOS switch circuit according to claim 1, wherein said first NMOS and said second NMOS transistors are sized relative to said first PMOS and said second PMOS transistors so as to have greater drive capability than said first PMOS and said second PMOS transistors.

3. The CMOS switch circuit according to claim 1, wherein said first NMOS and said second NMOS transistors are sized relative to said first PMOS and said second PMOS transistors so as to have at least twice the drive capability than said first PMOS and said second PMOS transistors.

4. The CMOS switch circuit according to claim 2, wherein said first NMOS and said second NMOS transistors are substantially identically sized, and said first PMOS and said second PMOS transistors are substantially identically sized.

5. The CMOS switch circuit according to claim 1, further comprising:

third NMOS and third PMOS transistors, said third NMOS transistor source coupled to said first output of said first pair of complementary outputs, said third PMOS transistor source coupled to said high reference voltage, said third NMOS and said third PMOS transistor gates coupled together and to said first output of said first pair of complementary outputs, and said third NMOS and said third PMOS transistor drains coupled together and driving a first output of a second pair of complementary outputs; and fourth PMOS and fourth NMOS transistors, said fourth PMOS transistor source coupled to said second output of said first pair of complementary outputs, said fourth NMOS transistor source coupled to said low reference voltage, said fourth PMOS and said fourth NMOS transistor gates coupled together and to said second output of said first pair of complementary outputs, and said fourth NMOS and said fourth PMOS transistor drains coupled together and driving a second output of said second pair of complementary outputs;

wherein said first PMOS, said first NMOS, said second NMOS, said second PMOS, said third NMOS, said third PMOS, said fourth PMOS, and said fourth NMOS transistors are sized such that said first and said second outputs of said second pair of complementary outputs are substantially concurrently switching complementary outputs in response to said input signal, and substantially process independent.

6. The CMOS switch circuit according to claim 5, wherein said first NMOS, said second NMOS, said third NMOS, and said fourth NMOS transistors are sized relative to said first PMOS, said second PMOS, said third PMOS, and said fourth PMOS transistors so as to have greater drive capability than said first PMOS, said second PMOS, said third PMOS, and said fourth PMOS transistors.

7. The CMOS switch circuit according to claim 5, wherein said first NMOS, said second NMOS, said third NMOS, and said fourth NMOS transistors are sized relative to said first PMOS, said second PMOS, said third PMOS, and said fourth PMOS transistors so as to have at least twice the drive capability as said first PMOS, said second PMOS, said third PMOS, and said fourth PMOS transistors.

8. The CMOS switch circuit according to claim 6, wherein said first NMOS, said second NMOS, said third NMOS, and said fourth NMOS transistors are substantially identically sized, and said first PMOS, said second PMOS, said third PMOS, and said fourth PMOS transistors are substantially identically sized.

9. The CMOS switch circuit according to claim 5, further comprising:
a second inverter, said second inverter input coupled to said first output of said first pair of complementary outputs, and said second inverter output coupled to said third NMOS transistor source;
a third inverter, said third inverter input coupled to said second inverter output, and said third inverter output coupled to said third NMOS and said third PMOS transistor gates; and
a fourth inverter, said fourth inverter input coupled to said third PMOS and said third NMOS transistor drains, and said fourth inverter output providing said first output of said second pair of complementary outputs.

10. The CMOS switch circuit according to claim 9, further comprising:
a fifth inverter, said fifth inverter input coupled to said second output of said first pair of complementary outputs, and said fifth inverter output coupled to said fourth PMOS transistor source;
a sixth inverter, said sixth inverter input coupled to said fifth inverter output, and said sixth inverter output coupled to said fourth PMOS and said fourth NMOS transistor gates; and
a seventh inverter, said seventh inverter input coupled to said fourth NMOS and said fourth PMOS transistor drains, and said seventh inverter output providing said second output of said second pair of complementary outputs.

11. A method of forming a CMOS switch circuit having concurrently switching complementary outputs, comprising:
forming on a semiconductor wafer, a first inverter having an input and output, said first inverter input coupled to an input signal;
forming on said semiconductor wafer, first PMOS and first NMOS transistors, said first PMOS transistor source coupled to said input signal, said first NMOS transistor source coupled to a low reference voltage, said first PMOS and said first NMOS transistor gates coupled to said first inverter output, and said first PMOS and said first NMOS transistor drains coupled together and providing a first output of a first pair of complementary outputs; and
forming on said semiconductor wafer, second NMOS and second PMOS transistors, said second NMOS transistor source coupled to said first inverter output, said second PMOS transistor source coupled to a high reference voltage, said second NMOS and said second PMOS transistor gates coupled to said input signal, and said second NMOS and said second PMOS transistor drains coupled together and providing a second output of said first pair of complementary outputs;
wherein said first PMOS, said first NMOS, said second NMOS, and said second PMOS transistors are sized such that said first and said second outputs of said first pair of complementary outputs are substantially concurrently switching complementary outputs in response to said input signal.

12. The method according to claim 11, wherein said first NMOS and said second NMOS transistors are formed so as to be sized relative to said first PMOS and said second PMOS transistors so as to have greater drive capability than said first PMOS and said second PMOS transistors.

13. The method according to claim 11, wherein said first NMOS and said second NMOS transistors are formed so as to be sized relative to said first PMOS and said second PMOS transistors so as to have at least twice the drive capability than said first PMOS and said second PMOS transistors.

14. The method according to claim 12, wherein said first NMOS and said second NMOS transistors are formed so as to be substantially identically sized, and said first PMOS and said second PMOS transistors are formed so as to be substantially identically sized.

15. The method according to claim 11, further comprising:
forming on said semiconductor wafer, third NMOS and third PMOS transistors, said third NMOS transistor source coupled to said first output of said first pair of complementary outputs, said third PMOS transistor source coupled to said high reference voltage, said third NMOS and said third PMOS transistor gates coupled together and to said first output of said first pair of complementary outputs, and said third NMOS and said third PMOS transistor drains coupled together and driving a first output of a second pair of complementary outputs, and
forming on said semiconductor wafer, fourth PMOS and fourth NMOS transistors, said fourth PMOS transistor source coupled to said second output of said first pair of complementary outputs, said fourth NMOS transistor source coupled to said low reference voltaic, said fourth PMOS and said fourth NMOS transistor gates coupled together and to said second output of said first pair of complementary outputs, and said fourth NMOS and said fourth PMOS transistor drains coupled together and driving a second output of said second pair of complementary outputs;
wherein said first PMOS, said first NMOS, said second NMOS, said second PMOS, said third NMOS, said third PMOS, said fourth PMOS, and said fourth NMOS transistors are sized such that said first and said second outputs of said second pair of complementary outputs are substantially concurrently switching complementary outputs in response to said input signal, and substantially process independent.

16. The method according to claim 15, wherein said first NMOS, said second NMOS, said third NMOS, and said fourth NMOS transistors are formed so as to be sized relative to said first PMOS, said second PMOS, said third PMOS, and said fourth PMOS transistors so as to have greater drive capability than said first PMOS, said second PMOS, said third PMOS, and said fourth PMOS transistors.

17. The method according to claim 15, wherein said first NMOS, said second NMOS, said third NMOS, and said fourth NMOS transistors are formed so as to be sized relative to said first PMOS, said second PMOS, said third PMOS, and said fourth PMOS transistors so as to have at least twice the drive capability as said first PMOS, said second PMOS, said third PMOS, and said fourth PMOS transistors.

18. The method according to claim 16, wherein said first NMOS, said second NMOS, said third NMOS, and said fourth NMOS transistors are formed so as to be substantially identically sized, and said first PMOS, said second PMOS, said third PMOS, and said fourth PMOS transistors are formed so as to be substantially identically sized.

19. The method according to claim 15, further comprising:
   forming on said semiconductor wafer, a second inverter, said second inverter input coupled to said first output of said first pair of complementary outputs, and said second inverter output coupled to said third NMOS transistor source;
   forming on said semiconductor wafer, a third inverter, said third inverter input coupled to said second inverter output, and said third inverter output coupled to said third NMOS and said third PMOS transistor gates; and
   forming on said semiconductor wafer, a fourth inverter, said fourth inverter input coupled to said third PMOS and said third NMOS transistor drains, and said fourth inverter output providing said first output of said second pair of complementary outputs.

20. The method according to claim 19, further comprising:
   forming on said semiconductor wafer, a fifth inverter, said fifth inverter input coupled to said second output of said first pair of complementary outputs, and said fifth inverter output coupled to said fourth PMOS transistor source;
   forming on said semiconductor wafer, a sixth inverter, said sixth inverter input coupled to said fifth inverter output, and said sixth inverter output coupled to said fourth PMOS and said fourth NMOS transistor gates; and
   forming on said semiconductor wafer, a seventh inverter, said seventh inverter input coupled to said fourth NMOS and said fourth PMOS transistor drains, and said seventh inverter output providing said second output of said second pair of complementary outputs.

* * * * *